United States Patent
Farwell et al.

(10) Patent No.: US 6,667,519 B2
(45) Date of Patent: Dec. 23, 2003

(54) MIXED TECHNOLOGY MICROCIRCUITS

(75) Inventors: William D. Farwell, Thousand Oaks, CA (US); Lloyd F. Linder, Agoura Hills, CA (US); Clifford W. Meyers, Rancho Palos Verdes, CA (US); Michael D. Vahey, Manhattan Beach, CA (US)

(73) Assignee: Raytheon Company, Lexington, MA (US)

( * ) Notice: Subject to any disclaimer, the term of this patent is extended or adjusted under 35 U.S.C. 154(b) by 66 days.

(21) Appl. No.: 09/909,718

(22) Filed: Jul. 20, 2001

(65) Prior Publication Data

US 2003/0015761 A1 Jan. 23, 2003

(51) Int. Cl.[7] .......................... H01L 29/76; H01L 29/94; H01L 31/062; H01L 31/113; H01L 31/119
(52) U.S. Cl. ....................................... 257/369; 257/370
(58) Field of Search ........................... 257/19, 369, 370

(56) References Cited

U.S. PATENT DOCUMENTS

| | | | |
|---|---|---|---|
| 5,790,540 A | * | 8/1998 | Buhrgard et al. ........... 370/391 |
| 6,057,598 A | * | 5/2000 | Payne et al. ................. 257/723 |
| 6,448,622 B1 | * | 9/2002 | Franke et al. ................ 257/415 |
| 2001/0008284 A1 | * | 7/2001 | Huang .......................... 257/66 |
| 2002/0072163 A1 | * | 6/2002 | Wong et al. ................. 438/200 |

* cited by examiner

Primary Examiner—Phat X. Cao
(74) Attorney, Agent, or Firm—Leonard A. Alkov; Glenn H. Lenzen, Jr.

(57) ABSTRACT

A mixed technology microcircuit including a first circuit fabricated on a first layer with a first technology and a second circuit fabricated on a second layer with a second technology. In the illustrative embodiment, the first circuit is fabricated with silicon germanium (SiGe) technology and the second circuit is fabricated with complementary metal-oxide semiconductor (CMOS) technology. In an illustrative application, the first circuit includes a high-speed data receiver and a high-speed data transmitter. In the illustrative implementation, the data receiver includes a line receiver, a data and clock recovery circuit, and a demultiplexer and the data transmitter includes a multiplexer, a data and clock encoding circuit, and a line driver.

6 Claims, 2 Drawing Sheets

MIXED TECHNOLOGY MICROCIRCUITS

BACKGROUND OF THE INVENTION

1. Field of the Invention

The present invention relates to digital semiconductor technology. More specifically, the present invention relates to semiconductor device architectures for improving the throughput of electronic circuits.

2. Description of the Related Art

Digital microcircuits are used in a wide variety of applications. Digital microcircuits are the building blocks of which computers and numerous other sophisticated electronic devices. A fundamental characteristic of digital semiconductor technology is that on-chip processing power is increasing at a faster rate than total input/output (I/O) bandwidth. This is due to the fact that while on-chip feature size continues to decrease at a steady rate, a corresponding rate of reduction in the feature size of I/O connections is not currently possible. Consequently, digital processing capability is increasingly limited by chip I/O bottlenecks.

This is most evident in signal processing applications where there are fewer processing operations per I/O data sample than in general-purpose applications and in architectures that achieve the highest number of possible operations per transistor, e.g., custom-purpose chips and reconfigurable computer chips. Indeed, it is anticipated that ultimately, i.e., beyond the year 2010, I/O bottlenecks will affect all forms of digital processing performance.

The conventional approach to this problem has been to increase the signal connections into and out of the chip. However, this approach is fundamentally limited by physical constraints. This is due to the fact that the leads must be large, relative to the transistors on-chip, to connect with the components with which the chip interfaces.

A second conventional approach to the problem has been to increase the frequency at which the signals are communicated to and from the chip. However, this approach has been limited by the bandwidth of the technology. Inasmuch as complementary metal-oxide semiconductor (CMOS) technology is currently favored for the digital processing applications, it is the bandwidth of CMOS technology that limits the utility of this approach.

Thus, a need remains in the art for a system or method for increasing the bandwidth of a semiconductor chip without increasing the number of leads into and out of the chip.

SUMMARY OF THE INVENTION

The need in the art is addressed by the mixed technology microcircuit of the present invention. Generally, the inventive microcircuit includes a first circuit fabricated on a first layer with a first technology and a second circuit fabricated on a second layer with a second technology.

In the illustrative embodiment, the first circuit is fabricated with bipolar transistors in silicon germanium (SiGe) technology and the second circuit is fabricated with complementary metal-oxide semiconductor (CMOS) transistors in silicon technology. Electrical connection between the two layers is effected by conductive via structures. In an illustrative application, the first circuit includes a high-speed data receiver and a high-speed data transmitter. In the illustrative implementation, the data receiver includes a line receiver, a data and clock recovery circuit, and a demultiplexer and the data transmitter includes a multiplexer, a data and clock encoding circuit, and a line driver.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

The present invention teaches the monolithic combination of two technologies. In an illustrative embodiment, silicon germanium (SiGe) bipolar input/output (I/O) transceivers are combined with silicon complementary metal-oxide semiconductor (CMOS) digital logic on a single microcircuit chip, to yield a greater digital processing throughput than could otherwise be attained. While, SiGe is applied to maximize I/O bandwidth in an otherwise silicon CMOS chip, it is not used for logic applications because its power/performance ratio is inferior to that of silicon CMOS. Its use for I/O, however, allows silicon CMOS to be used to its fullest capability. The present teachings are best illustrated with reference to the following figures.

Figure 1:
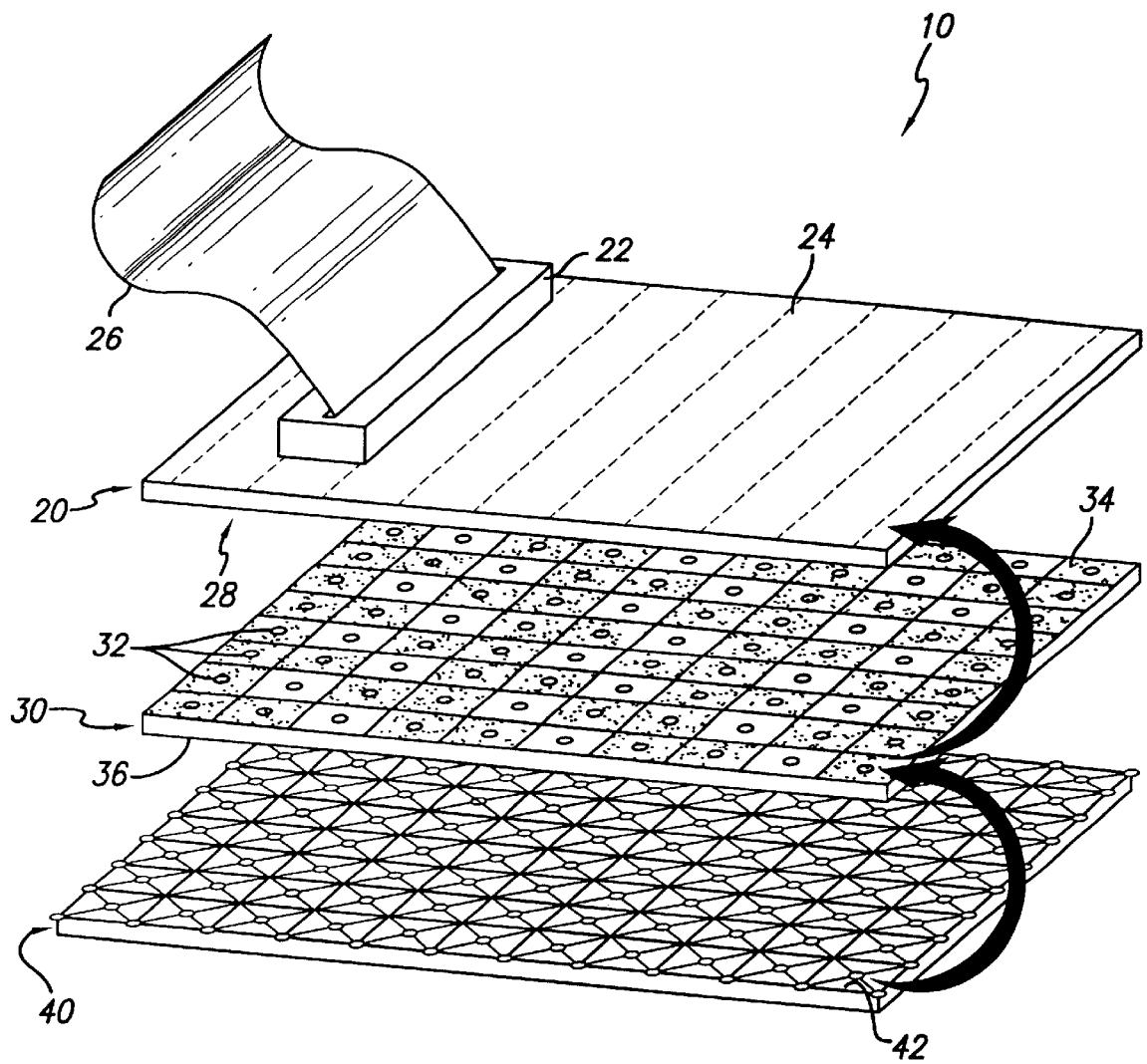
FIG. 1 is a simplified, magnified perspective view of a microcircuit implemented in accordance with the present teachings in disassembled relation.

FIG. 1 is a simplified, magnified perspective view of a microcircuit implemented in accordance with the present teachings in disassembled relation. As discussed more fully below, the present invention provides a microcircuit with ultra high-speed I/O ports and an I/O bandwidth that matches an optical fiber bandwidth. In the illustrative embodiment, the microcircuit can is implemented as a stack with three layers: a pad layer 20, an I/O layer 30, and a processing layer 40. The pad layer 20 serves as the physical connection point for I/O signals external to the device, using a plurality of solder bumps or columns, according to existing practice in integrated circuit (IC) fabrication. In the illustrative embodiment, an optical transceiver 22, with a multiplicity of I/O signals, is fixed to the upper surface 24 of pad layer 20. In a typical application, the transceiver 22 is connected to an analog to digital (A/D) or D/A converter, or to other high speed data sources or destinations (not shown).

A number of high-speed I/O ports are disposed in the I/O layer 30. In accordance with the present teachings, the second layer 30 is implemented with a high-speed technology such as SiGe. Electrical connection is made to the plurality of bumps on the under surface of the pad layer 20 by use of vertical conductive vias. Vias also provide connections between the I/O layer 30 and the processor layer 40. These connections between layers are made with vertical via structures, according to existing practice in IC fabrication, well known to those of ordinary skill in the art.

Figure 2:
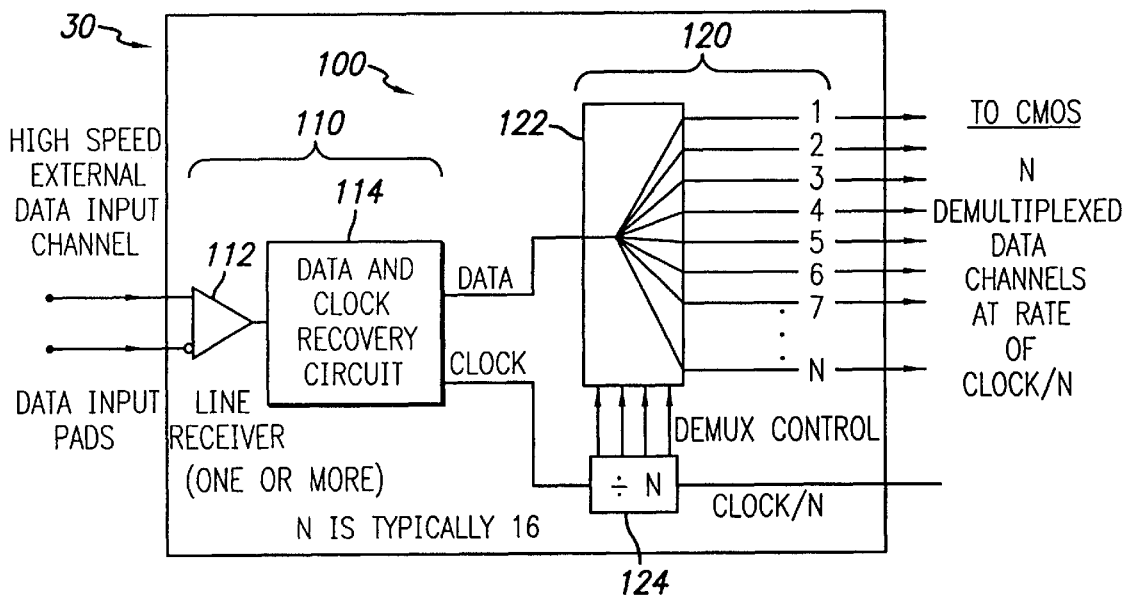
FIG. 2 is a block diagram showing a high-speed receiver of the illustrative embodiment of a microcircuit implemented in accordance with the present teachings.
Figure 3:
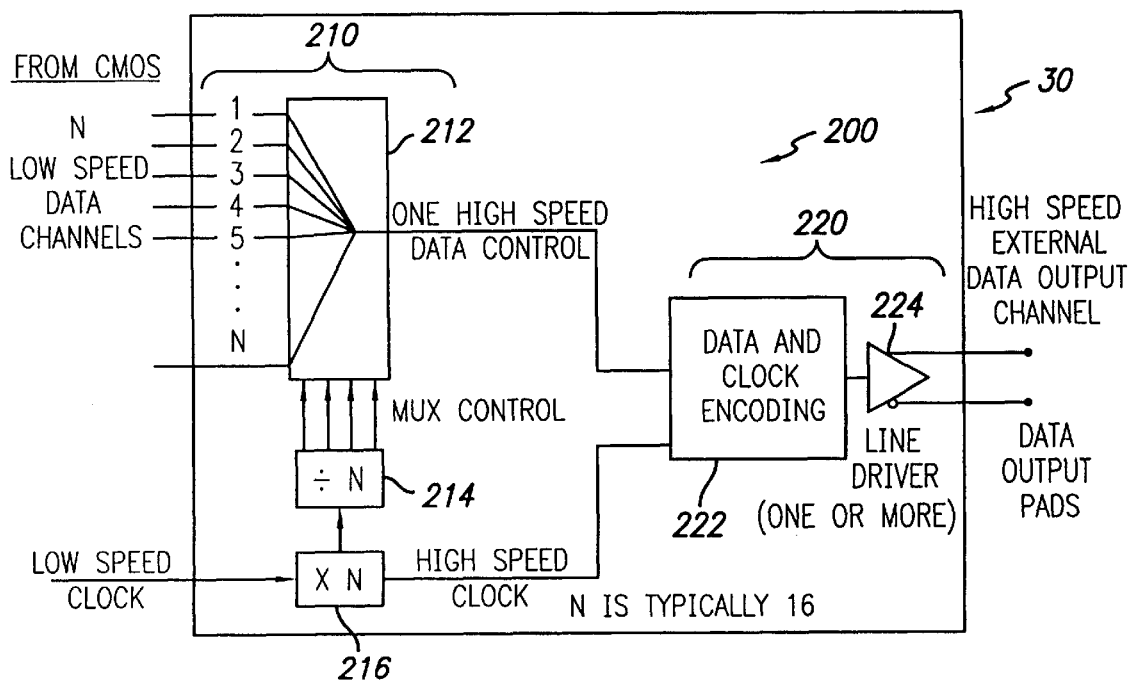
FIG. 3 is a block diagram showing a high-speed transmitter of the illustrative embodiment of a microcircuit implemented in accordance with the present teachings.

FIG. 2 and FIG. 3 are block diagrams showing the high speed input and output port circuits, respectively, provided in the I/O layer 30. The function of an I/O port is to (1) receive or drive a single channel of data on or off the microcircuit at high speed, (2) convert the single channel to/from a multiplicity (N) of CMOS channels, each with a reduced data rate (1/N times the high speed rate). Thus the bandwidth employed by the CMOS logic for a port is sufficient for the high-speed device I/O. Since N internal CMOS channels are converted to a single I/O channel, the number of physical pads is reduced by a factor of N. The details of a receive port are shown in FIG. 2.

FIG. 2 is a block diagram showing a high-speed receiver and demultiplexer 100 of the illustrative embodiment of a microcircuit implemented in accordance with the present teachings. It consists of high-speed receiver circuitry 110 and a clock divider and data demultiplexer circuit 120. The receiver 110 has a line receiver 112 and a circuit 114 to recover and/or align clock and data. Those of ordinary skill in the art will appreciate that there are numerous methods in the existing art to implement this receive function. A key point is that, in accordance with the present teachings, by using SiGe transistors, the receive circuit 110 will run N times faster than in CMOS (where for example, N=16).

The clock divider and data demultiplexer 120 includes a demultiplexer 122 driven by a clock divider 124. The clock divider and data demultiplexer 120 converts the one input channel to N parallel channels, each clocked at a rate of 1/N of the original. The N parallel input channels are connected to CMOS logic disposed on layer 40. Since the divider/demultiplexer circuit executes on high-speed inputs, it, also must use SiGe transistors. The details of an output port are shown in FIG. 3.

FIG. 3 is a block diagram showing a high-speed multiplexer and transmitter 200 of the illustrative embodiment of a microcircuit implemented in accordance with the present teachings. It consists of a clock multiplier and data multiplexer 210 and high speed drive circuitry 220. The clock multiplier/data multiplexer 210 includes a multiplexer 212. The multiplexer 212 is driven by a clock divider 214 and a clock multiplier 216. The clock multiplier/data multiplexer 210 converts N parallel CMOS output channels (from CMOS logic disposed on layer 40) to a single, time-multiplexed channel running at N times the clock rate.

The high-speed driver 220 encodes and/or aligns clock and data, and buffers the channel off the device. The high-speed driver 220 includes a data and clock encoder 222 and a line driver 224. Those skilled in the art will appreciate that there are numerous methods in the art to implement the above-noted drive function.

As will be appreciated by those of ordinary skill in the art, the present teachings are not limited to the illustrative implementation of the I/O circuit. That is, a significant aspect of the invention is the implementation of the I/O circuit in a high-speed technology such as silicon germanium bipolar, high bandwidth transistors.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

Accordingly,

What is claimed is:

1. A high speed circuit comprising:
    an input/output layer implemented with a first technology and having a plurality of input circuits and output circuits,
    said input circuits comprising:
        a plurality of input lines,
        a plurality of demultiplexers, each having a respective one of said input lines as an input thereof and providing a plurality of outputs in response thereto, and
        means for controlling each of said demultiplexers and
    said output circuits comprising:
        a plurality of input lines,
        a plurality of multiplexers, each having a respective set of said input lines as inputs thereto and a single output line, and
        means for controlling each of said multiplexers and
    a processing layer implemented with a second technology coupled to said input circuits and said output circuits.

2. The invention of claim 1 wherein said first technology is a higher speed technology relative to said second technology.

3. The invention of claim 2 wherein said first technology is silicon-germanium.

4. The invention of claim 3 wherein said second technology is complementary metal oxide semiconductor.

5. The invention of claim 1 further including a pad layer interfacing with said first layer.

6. The invention of claim 5 further including an optical transceiver coupled to said pad layer.

* * * * *